US011404799B2

(12) United States Patent
Chen et al.

(10) Patent No.: US 11,404,799 B2
(45) Date of Patent: Aug. 2, 2022

(54) SEMICONDUCTOR DEVICE PACKAGE AND METHOD OF MANUFACTURING THE SAME

(71) Applicant: Advanced Semiconductor Engineering, Inc., Kaohsiung (TW)

(72) Inventors: Ting Ruei Chen, Kaohsiung (TW); Guo-Cheng Liao, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 196 days.

(21) Appl. No.: 16/663,079

(22) Filed: Oct. 24, 2019

(65) Prior Publication Data

US 2021/0125945 A1 Apr. 29, 2021

(51) Int. Cl.

| | |
|---|---|
| ***H03M 1/38*** | (2006.01) |
| ***H01Q 23/00*** | (2006.01) |
| ***H01Q 1/22*** | (2006.01) |
| ***H01Q 1/38*** | (2006.01) |
| ***H01Q 21/06*** | (2006.01) |
| *H01Q 9/04* | (2006.01) |

(52) U.S. Cl.

CPC .......... *H01Q 23/00* (2013.01); *H01Q 1/2283* (2013.01); *H01Q 1/38* (2013.01); *H01Q 21/065* (2013.01); *H01Q 9/0414* (2013.01)

(58) Field of Classification Search

CPC ......... H01Q 1/2283; H01Q 1/38; H01L 23/66

USPC .......................................................... 343/873

See application file for complete search history.

(56) References Cited

U.S. PATENT DOCUMENTS

| | | | | |
|---|---|---|---|---|
| 9,620,464 | B2 | 4/2017 | Baks et al. | |
| 9,728,840 | B2 * | 8/2017 | Shi | H01Q 1/38 |
| 10,741,508 | B2 * | 8/2020 | Wan | H01L 23/5226 |
| 2014/0168014 | A1 * | 6/2014 | Chih | H01L 21/56 343/700 MS |
| 2018/0331050 | A1 * | 11/2018 | Chung | H01L 23/3121 |
| 2020/0058626 | A1 * | 2/2020 | Tai | H01L 23/49822 |
| 2021/0104809 | A1 * | 4/2021 | Lee | H01L 21/6835 |

OTHER PUBLICATIONS

U.S. Appl. No. 16/375,640, filed Apr. 4, 2019, Guo-Cheng Liao.

* cited by examiner

*Primary Examiner* — Peguy Jean Pierre

(74) *Attorney, Agent, or Firm* — Foley & Lardner LLP

(57) ABSTRACT

A semiconductor device package includes a substrate, a support structure and a first antenna. The substrate has a first surface and a second surface opposite to the first surface. The support structure is disposed on the first surface of the substrate. The first antenna is disposed on the support structure. The first antenna has a first surface facing the substrate, a second surface opposite to the first surface and a lateral surface extending between the first surface and a second surface of the first antenna. The lateral surface of the first antenna is exposed to the external of the semiconductor device package. The first antenna includes a dielectric layer and an antenna pattern disposed within the dielectric layer and penetrating the dielectric layer.

19 Claims, 21 Drawing Sheets

SEMICONDUCTOR DEVICE PACKAGE AND METHOD OF MANUFACTURING THE SAME

BACKGROUND

1. Technical Field

The present disclosure relates generally to a semiconductor device package and a method of manufacturing the same.

2. Description of the Related Art

Wireless communication devices, such as cell phones, typically include antennas for transmitting and receiving radio frequency (RF) signals. In recent years, with the continuous development of mobile communication and the pressing demand for high data rate and stable communication quality, relatively high frequency wireless transmission (e.g., 28 GHz or 60 GHz) has become one of the most important topics in the mobile communication industry. In a comparative approach, the antenna is disposed within or on a dielectric layer, and the RF signal is transmitted or received by the antenna through the dielectric layer. However, as the frequency of the transmitted or received RF signal increases, the signal attenuation or signal loss of the RF signal transmitting in the dielectric layer becomes an issue/problem.

SUMMARY

In one or more embodiments, a semiconductor device package includes a substrate, a support structure and a first antenna. The substrate has a first surface and a second surface opposite to the first surface. The support structure is disposed on the first surface of the substrate. The first antenna is disposed on the support structure. The first antenna has a first surface facing the substrate, a second surface opposite to the first surface and a lateral surface extending between the first surface and a second surface of the first antenna. The lateral surface of the first antenna is exposed to the external of the semiconductor device package. The first antenna includes a dielectric layer and an antenna pattern disposed within the dielectric layer and penetrating the dielectric layer.

In one or more embodiments, a semiconductor device package includes a substrate and a first antenna. The substrate has a first surface and a second surface opposite to the first surface. The first antenna is disposed on the first surface of the substrate. The first antenna has a dielectric layer and an antenna pattern. The dielectric layer has a first surface facing away from the substrate, a second surface opposite to the first surface and spaced apart from the first surface of the substrate and a third surface in contact with the first surface of the substrate. The antenna pattern is disposed within the dielectric layer and exposed from the first surface and the second surface of the dielectric layer.

In one or more embodiments, a method of manufacturing a semiconductor device package includes (a) providing a carrier; (b) forming an antenna layer on the carrier; (c) forming a first dielectric layer on the carrier to cover the antenna layer and to expose a top surface of the antenna layer; and (d) forming a second dielectric layer on the first dielectric layer and adjacent to the periphery of the first dielectric layer to expose the antenna layer.

BRIEF DESCRIPTION OF THE DRAWINGS

Aspects of the present disclosure are readily understood from the following detailed description when read with the accompanying drawings. It is noted that various features may not be drawn to scale, and the dimensions of the various features may be arbitrarily increased or reduced for clarity of discussion.

Common reference numerals are used throughout the drawings and the detailed description to indicate the same or similar elements. The present disclosure will be more apparent from the following detailed description taken in conjunction with the accompanying drawings.

DETAILED DESCRIPTION

Figure 1A:
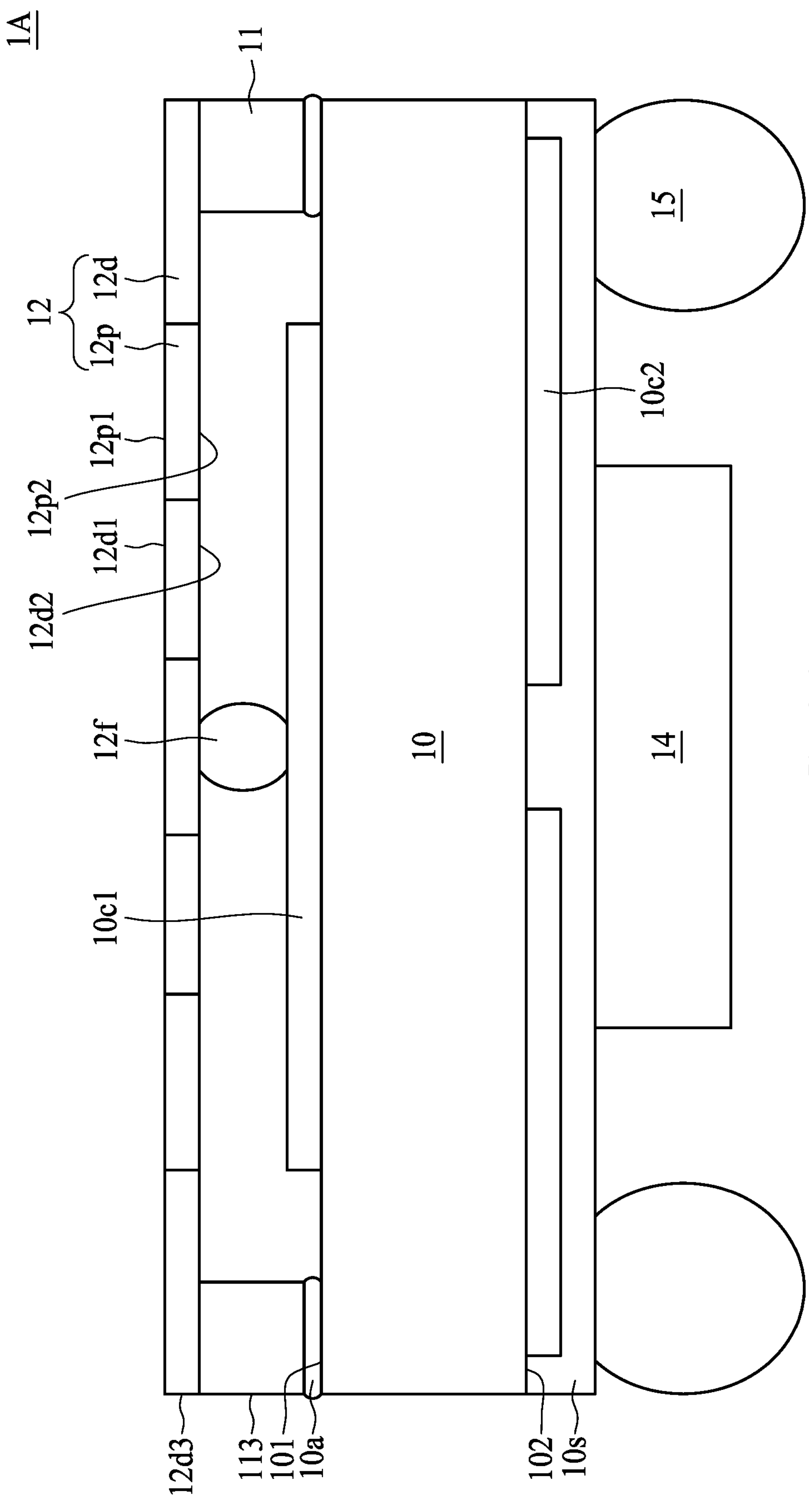
FIG. 1A illustrates a cross-sectional view of a semiconductor device package in accordance with some embodiments of the present disclosure.

The following disclosure provides for many different embodiments, or examples, for implementing different features of the provided subject matter. Specific examples of components and arrangements are described below. These are, of course, merely examples and are not intended to be limiting. In the present disclosure, reference to the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Embodiments of the present disclosure are discussed in detail below. It should be appreciated, however, that the present disclosure provides many applicable concepts that can be embodied in a wide variety of specific contexts. The specific embodiments discussed are merely illustrative and do not limit the scope of the disclosure.

FIG. 1A illustrates a cross-sectional view of a semiconductor device package 1A in accordance with some embodiments of the present disclosure. The semiconductor device package 1A includes a substrate 10, a support structure 11, an antenna 12, an electronic component 14 and electrical contacts 15.

The substrate 10 may be, for example, a printed circuit board, such as a paper-based copper foil laminate, a composite copper foil laminate, or a polymer-impregnated glass-fiber-based copper foil laminate. The substrate 10 may include opposite surfaces 101 and 102 (e.g., a top surface and a bottom surface). The substrate 10 may include an interconnection structure (e.g., an electrical connection), such as a redistribution layer (RDL). The substrate 10 may include metal layers 10*c*1 and 10*c*2 respectively on its surfaces 101 and 102. In some embodiments, the metal layer 10*c*1 is a grounding layer.

The support structure 11 is disposed on the surface 101 of the substrate 10. For example, the support structure 11 is connected to the surface 101 of the substrate 10 through a connection element 10*a*. In some embodiments, the support structure 11 is formed of or includes a dielectric material. For example, the support structure 11 may include molding compounds, pre-impregnated composite fibers (e.g., pre-preg), Borophosphosilicate Glass (BPSG), silicon oxide, silicon nitride, silicon oxynitride, Undoped Silicate Glass (USG), any combination thereof, or the like. Examples of molding compounds may include, but are not limited to, an epoxy resin including fillers dispersed therein. Examples of a pre-preg may include, but are not limited to, a multi-layer structure formed by stacking or laminating a number of pre-impregnated materials/sheets.

The antenna 12 is disposed on the support structure 11. The antenna 12 is spaced apart from the surface 101 of the substrate 10. For example, there is a gap between the antenna 12 and the substrate 10. The antenna 12 includes a dielectric layer 12*d* and an antenna pattern 12*a*. The antenna pattern 12*p* is embedded within the dielectric layer 12*d* and exposed from surfaces 12*d*1 and 12*d*2 of the dielectric layer 12*d*. For example, a surface 12*p*1 of the antenna pattern 12*p* is substantially coplanar with the surface 12*d*1 of the dielectric layer 12*d*, and a surface 12*p*2 of the antenna pattern 12*p* is substantially coplanar with the surface 12*d*2 of the dielectric layer 12*d*. For example, the thickness of the antenna pattern 12*p* is substantially the same as the thickness of the dielectric layer 12*d*. For example, the surfaces 12*p*1 and 12*p*2 of the antenna pattern 12*a* are exposed to air. For example, the surfaces 12*p*1 and 12*p*2 of the antenna pattern 12*a* are in direct contact to air. In some embodiments, the semiconductor device package 1A is disposed within a vacuum space or a vacuum cavity and thus the surfaces 12*p*1 and 12*p*2 of the antenna pattern 12*a* are exposed to vacuum. In some embodiments, the antenna pattern 12*p* is, or includes, a conductive material such as a metal or metal alloy. Examples of the conductive material include gold (Au), silver (Ag), aluminum (Al), copper (Cu), or an alloy thereof.

The antenna pattern 12*p* may be electrically connected to the metal layer 10*c*1 through a connection structure 12*f*. In some embodiments, the connection structure 12*f* may function as a feeding element to provide signal to the antenna pattern 12*p*. In some embodiments, the connection structure 12*f* connecting the antenna pattern 12*p* to the ground with the help of the metal layer 10*c*1. In some embodiments, the connection structure 12*f* may include, but not limited to, a solder ball, a metal pillar, a bonding wire or stacked vias. In some embodiments, the connection structure 12*f* includes Au, Ag, Al, Cu, or an alloy thereof. In some embodiments, the connection structure 12*f* is omitted, and the metal layer 10*c*1 may be electromagnetically coupled with the antenna pattern 12*p*. In some embodiments, the metal layer 10*c*1 and the antenna 12 may be referred to as an antenna structure.

In some embodiments, the antenna pattern 12*p* may include a uniform width as shown in FIG. 1A. In some embodiments, as shown in FIG. 1C and FIG. 1D (which illustrate cross-sectional views of the antenna 12 in accordance with some embodiments of the present disclosure), the antenna pattern 12*p* include a non-uniform width. For example, as shown in FIG. 1C, a width of the surface 12*p*1 of the antenna pattern 12*p* is greater than a width of the surface 12*p*2 of the antenna pattern 12*p*. For example, as shown in FIG. 1D, a width of the antenna pattern 12*p* between the surfaces 12*p*1 and 12*p*2 is greater than a width of the surface 12*p*1 or 12*p*2 of the antenna pattern 12*p*.

The dielectric layer 12*d* is disposed on the support structure 11. In some embodiments, the dielectric layer 12*d* is in direct contact with the support structure 11. In some embodiments, the dielectric layer 12*d* has a lateral surface 12*d*3 exposed to air. In some embodiments, the lateral surface 12*d*3 of the dielectric layer 12*d* is exposed to the outside of the semiconductor device package 1A. In some embodiments, the lateral surface 12*d*3 of the dielectric layer 12*d* is substantially coplanar with the lateral surface 113 of the support structure 11. In some embodiments, the dielectric layer 12*d* may include molding compounds, pre-impregnated composite fibers (e.g., pre-preg), BPSG, silicon oxide, silicon nitride, silicon oxynitride, USG, any combination thereof, or the like. Examples of molding compounds may include, but are not limited to, an epoxy resin including fillers dispersed therein. Examples of a pre-preg may include, but are not limited to, a multi-layer structure formed by stacking or laminating a number of pre-impregnated materials/sheets. In some embodiments, the dielectric layer 12*d* and the support structure 11 are formed of or include the same material. For example, both the dielectric layer 12*d* and the support structure 11 are formed of a molding compound. Alternatively, the dielectric layer 12*d* and the support structure 11 are formed of different materials. In some embodiments, the antenna 12 and the support structure 11 may be collectively referred to as an antenna structure.

Figure 1B:
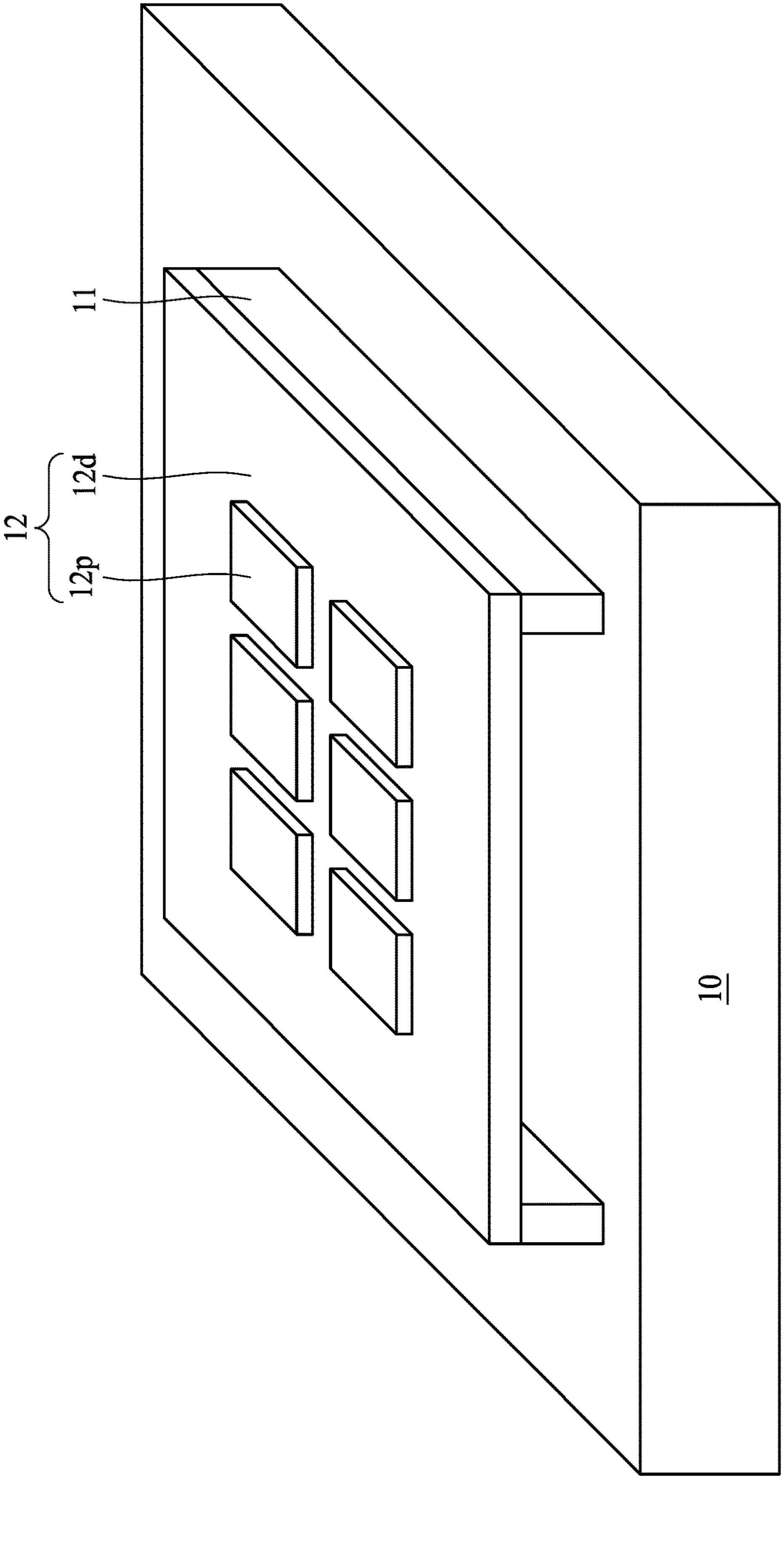
FIG. 1B illustrates a perspective view of a semiconductor device package in accordance with some embodiments of the present disclosure.
Figure 1C:
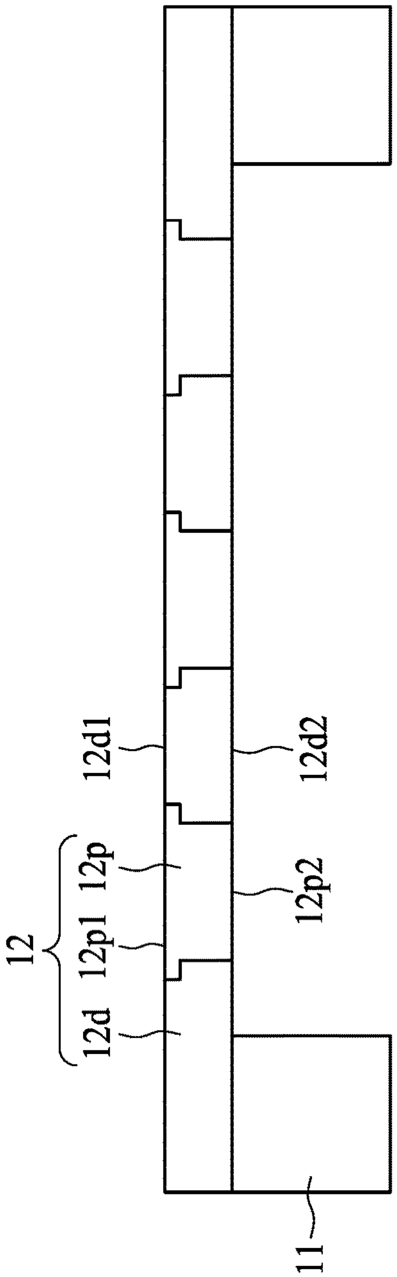
FIG. 1C illustrates a cross-sectional view of an antenna structure in accordance with some embodiments of the present disclosure.
Figure 1D:
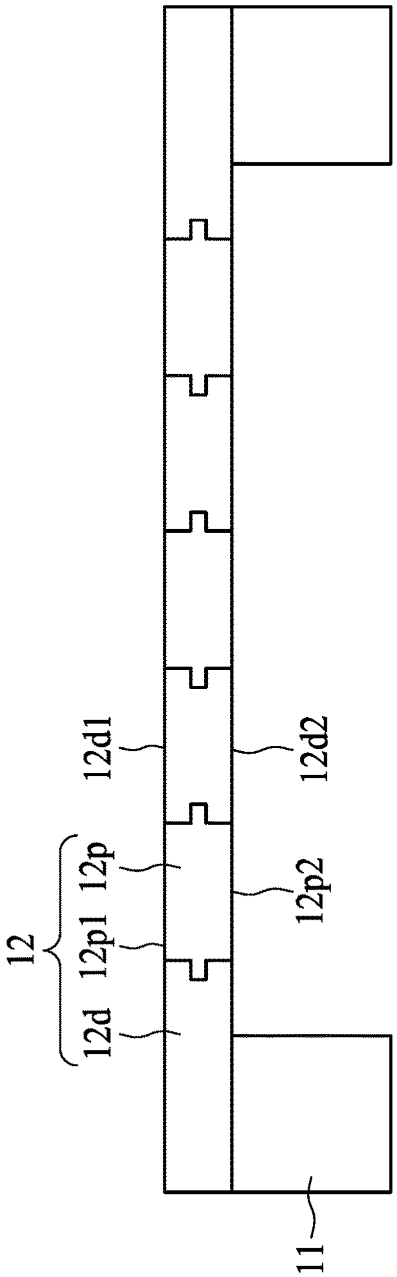
FIG. 1D illustrates a cross-sectional view of an antenna structure in accordance with some embodiments of the present disclosure.

In some embodiments, as shown in FIG. 1A and FIG. 1B (which illustrates a perspective view of the semiconductor device package 1A as shown in FIG. 1A), the substrate 10, the support structure 11 and the antenna 12 define an air gap. For example, there is no dielectric material between the antenna 12 and the metal plate 10*c*1. Thus, the RF signal is transmitted or received by the antenna 12 through air. Since Df/Dk (e.g., 0/1) of the air are lower than those of any dielectric materials, the signal attenuation or signal loss of the RF signal can be reduced, which will improve performance of the antenna 12 (e.g., 1.3 to 2.3 times better). In addition, since the antenna pattern 12*p* is not required to connect to a dielectric layer in a direction perpendicular to the surface 12*p*1 or 12*p*2 of the antenna pattern 12*p*, the surfaces 12*p*1 and 12*p*2 of the antenna pattern 12*p* are relatively smooth (e.g., no roughness on the surfaces 12*p*1 and 12*p*2 of the antenna pattern 12*p* is required), which will improve performance of the antenna 12.

Referring back to FIG. 1A, the electronic component 14 is disposed on the surface 102 of the substrate 10 and electrically connected to the substrate 10 through, for example, flip-chip or wire-bond technique. The electronic component 14 may be a chip or a die including a semiconductor substrate, one or more integrated circuit devices and one or more overlying interconnection structures therein. The integrated circuit devices may include active devices such as transistors and/or passive devices such resistors, capacitors, inductors, or a combination thereof.

The electrical contacts 15 are disposed on the surface 102 of the substrate 10 and electrically connected to the metal layer 10_c_2 exposed from the protection layer 10_s_ (e.g., solder mask or solder resist). In some embodiments, the electrical contacts 15 are solder balls. In other embodiments, the electrical contacts 15 can be copper pillars or any other suitable electrical contacts.

Figure 1E:
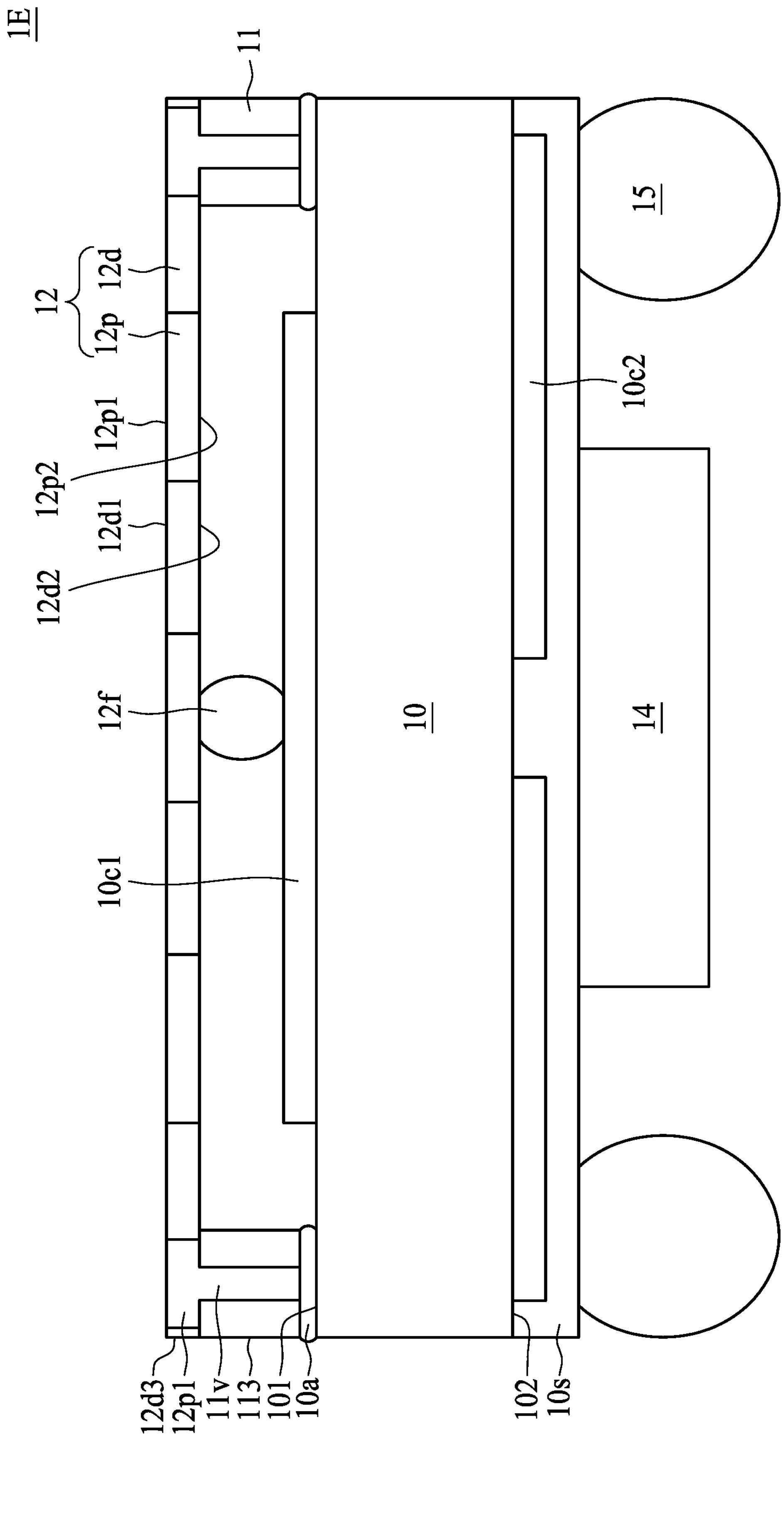
FIG. 1E illustrates a cross-sectional view of a semiconductor device package in accordance with some embodiments of the present disclosure.

FIG. 1E illustrates a cross-sectional view of a semiconductor device package 1E in accordance with some embodiments of the present disclosure. The semiconductor device package 1E is similar to the semiconductor device package 1A as shown in FIG. 1A, and the differences therebetween are described below.

The antenna 12 further includes a conductive layer 12_p_1 disposed within the dielectric layer 12_d_. The support structure 11 includes a through via 11_v_ penetrating the support structure 11 and electrically connects the conductive layer 12_p_1 to the substrate 10 (e.g., to the connection element 10_a_). In some embodiments, the through via 11_v_ includes Au, Ag, Al, Cu, or an alloy thereof. The through via 11_v_ can enhance the strength of the support structure 11.

Figure 2A:
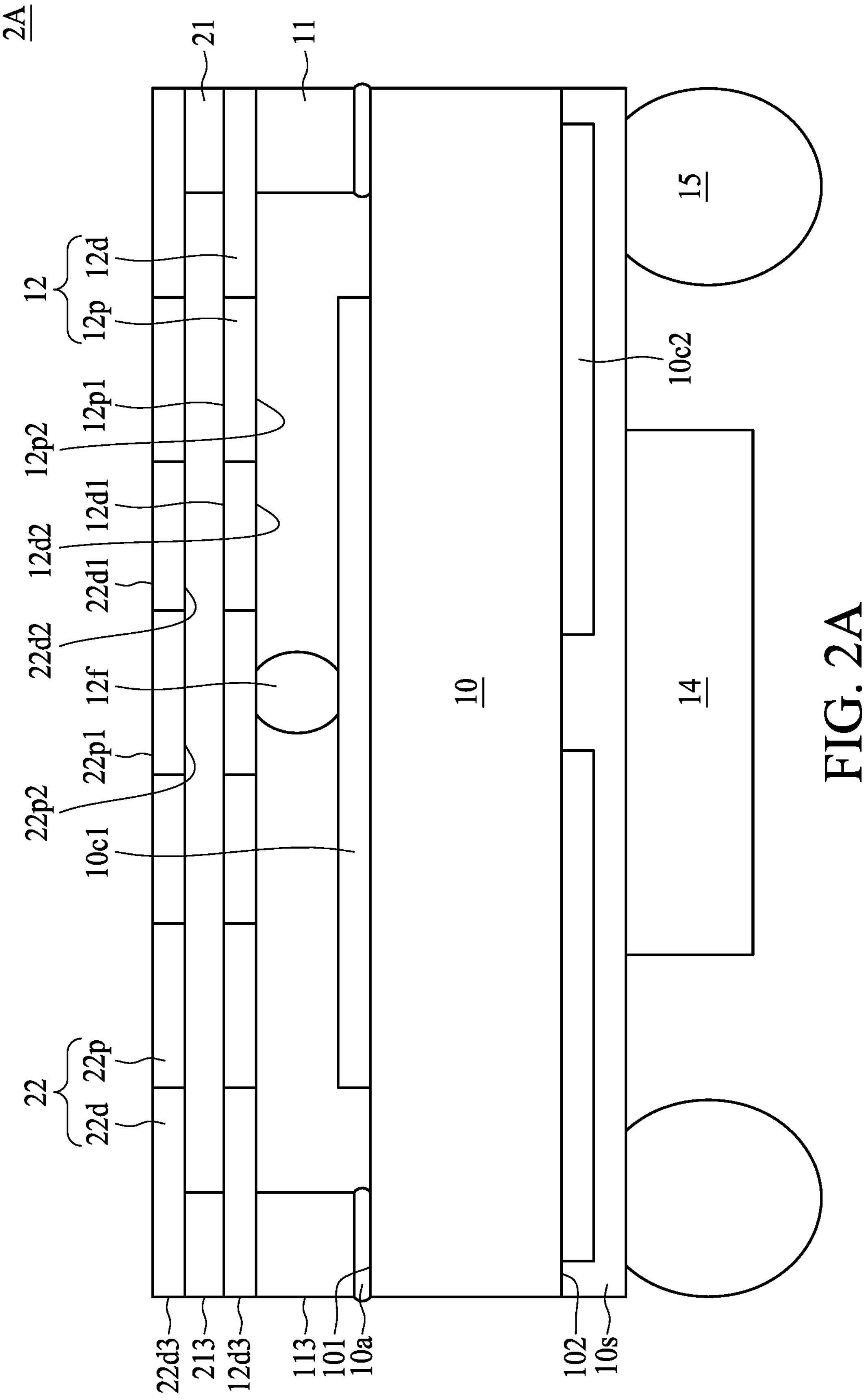
FIG. 2A illustrates a cross-sectional view of a semiconductor device package in accordance with some embodiments of the present disclosure.

FIG. 2A illustrates a cross-sectional view of a semiconductor device package 2A in accordance with some embodiments of the present disclosure. The semiconductor device package 2A is similar to the semiconductor device package 1A as shown in FIG. 1A, except that the semiconductor device package 2A further includes an antenna structure (including a support structure 21 and an antenna 22) disposed on the antenna 12.

The support structure 21 is disposed on the surface 12_d_1 of the dielectric layer 12_d_. In some embodiments, the support structure 21 is formed of or includes a dielectric material. For example, the support structure 21 may include molding compounds, pre-impregnated composite fibers (e.g., pre-preg), BPSG, silicon oxide, silicon nitride, silicon oxynitride, USG, any combination thereof, or the like. Examples of molding compounds may include, but are not limited to, an epoxy resin including fillers dispersed therein. Examples of a pre-preg may include, but are not limited to, a multi-layer structure formed by stacking or laminating a number of pre-impregnated materials/sheets.

The antenna 22 is disposed on the support structure 21. The antenna 22 is spaced apart from the antenna 12 through the support structure 21. For example, there is a gap between the antenna 12 and the antenna 22. The antenna 22 includes a dielectric layer 22_d_ and an antenna pattern 22_a_. The antenna pattern 22_p_ is embedded within the dielectric layer 22_d_ and exposed from surfaces 22_d_1 and 22_d_2 of the dielectric layer 22_d_. For example, a surface 22_p_1 of the antenna pattern 22_p_ is substantially coplanar with the surface 22_d_1 of the dielectric layer 22_d_, and a surface 22_p_2 of the antenna pattern 22_p_ is substantially coplanar with the surface 22_d_2 of the dielectric layer 22_d_. For example, the thickness of the antenna pattern 22_p_ is substantially the same as the thickness of the dielectric layer 22_d_. For example, the surfaces 22_p_1 and 22_p_2 of the antenna pattern 22_a_ are exposed to air. For example, the surfaces 22_p_1 and 22_p_2 of the antenna pattern 22_a_ are in direct contact to air. In some embodiments, the semiconductor device package 2A is disposed within a vacuum space or a vacuum cavity and thus the surfaces 22_p_1 and 22_p_2 of the antenna pattern 22_a_ are exposed to vacuum. In some embodiments, the antenna pattern 22_p_ is, or includes, a conductive material such as a metal or metal alloy. Examples of the conductive material include Au, Ag, Al, Cu, or an alloy thereof.

The antenna pattern 22_p_ is substantially aligned with the antenna pattern 11_p_. The antenna pattern 22_p_ is electromagnetically coupled to the antenna pattern 12_p_. In some embodiments, the antenna pattern 22_p_ may include a uniform width as shown in FIG. 2. In some embodiments, the antenna pattern 22_p_ may include the shape as shown in FIG. 1C or FIG. 1D depending on different design specifications.

The dielectric layer 22_d_ is disposed on the support structure 21. In some embodiments, the dielectric layer 22_d_ is in direct contact with the support structure 21. In some embodiments, the dielectric layer 22_d_ has a lateral surface 22_d_3 exposed to air. In some embodiments, the lateral surface 22_d_3 of the dielectric layer 22_d_ is exposed to the outside of the semiconductor device package 2A. In some embodiments, the lateral surface 22_d_3 of the dielectric layer 22_d_ is substantially coplanar with the lateral surface 12_d_3 of the dielectric layer 12_d_ and the lateral surface 213 of the support structure 21. In some embodiments, the dielectric layer 22_d_ may include molding compounds, pre-impregnated composite fibers (e.g., pre-preg), BPSG, silicon oxide, silicon nitride, silicon oxynitride, USG, any combination thereof, or the like. Examples of molding compounds may include, but are not limited to, an epoxy resin including fillers dispersed therein. Examples of a pre-preg may include, but are not limited to, a multi-layer structure formed by stacking or laminating a number of pre-impregnated materials/sheets. In some embodiments, the dielectric layer 22_d_ and the support structure 21 are formed of or include the same material. For example, both the dielectric layer 22_d_ and the support structure 21 are formed of a molding compound. Alternatively, the dielectric layer 22_d_ and the support structure 21 are formed of different materials.

Figure 2B:
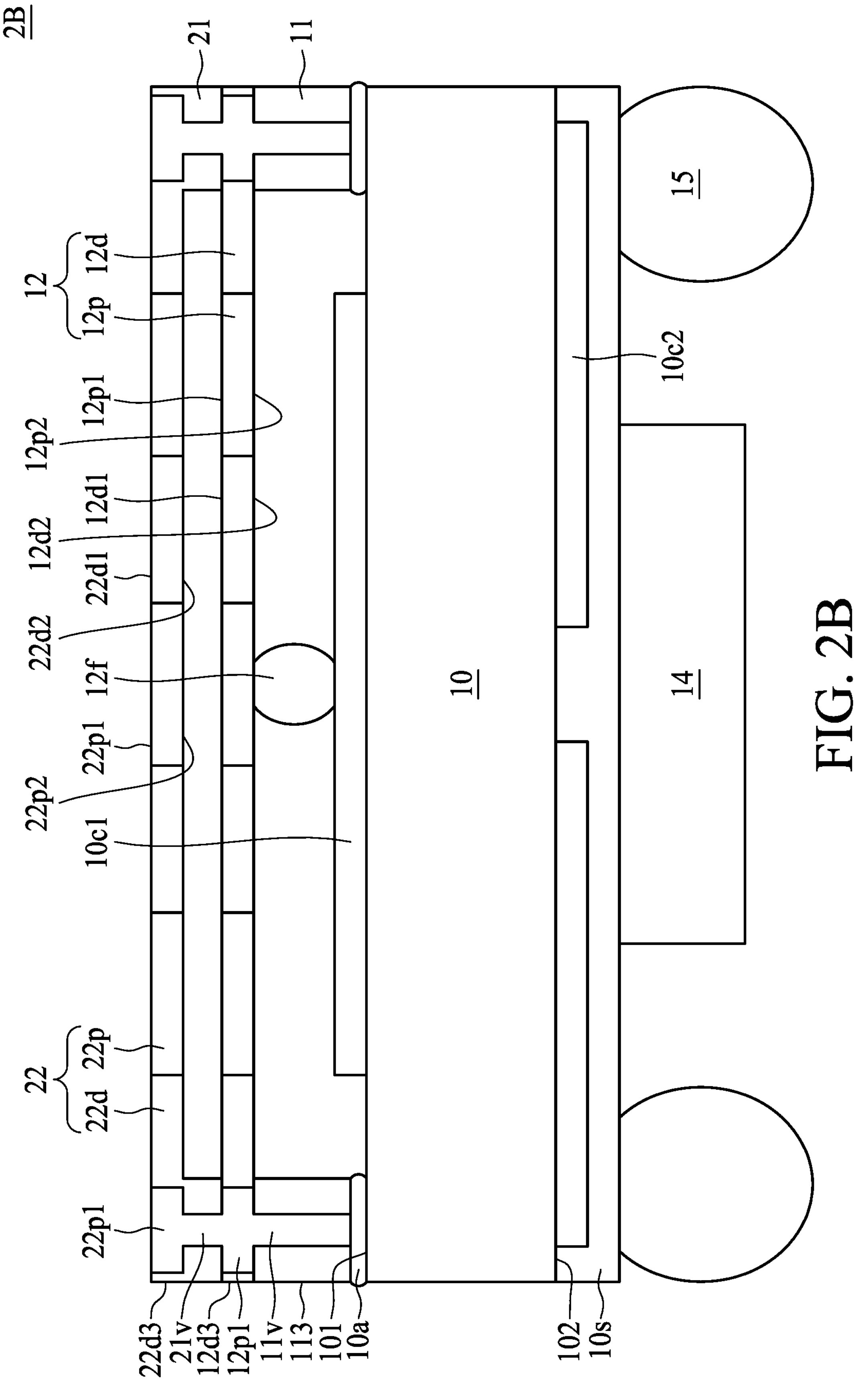
FIG. 2B illustrates a cross-sectional view of a semiconductor device package in accordance with some embodiments of the present disclosure.

FIG. 2B illustrates a cross-sectional view of a semiconductor device package in accordance with some embodiments of the present disclosure. The semiconductor device package in FIG. 2B is similar to the semiconductor device package 2A as shown in FIG. 2A, and the differences therebetween are described below.

The antenna 22 further includes a conductive layer 22_p_1 disposed within the dielectric layer 22_d_. The support structure 21 includes a through via 21_v_ penetrating the support structure 21 and electrically connects the conductive layer 22_p_1 to the conductive layer 12_p_1. In some embodiments, the through via 21_v_ includes Au, Ag, Al, Cu, or an alloy thereof. The through via 21_v_ can enhance the strength of the support structure 21.

Figure 2C:
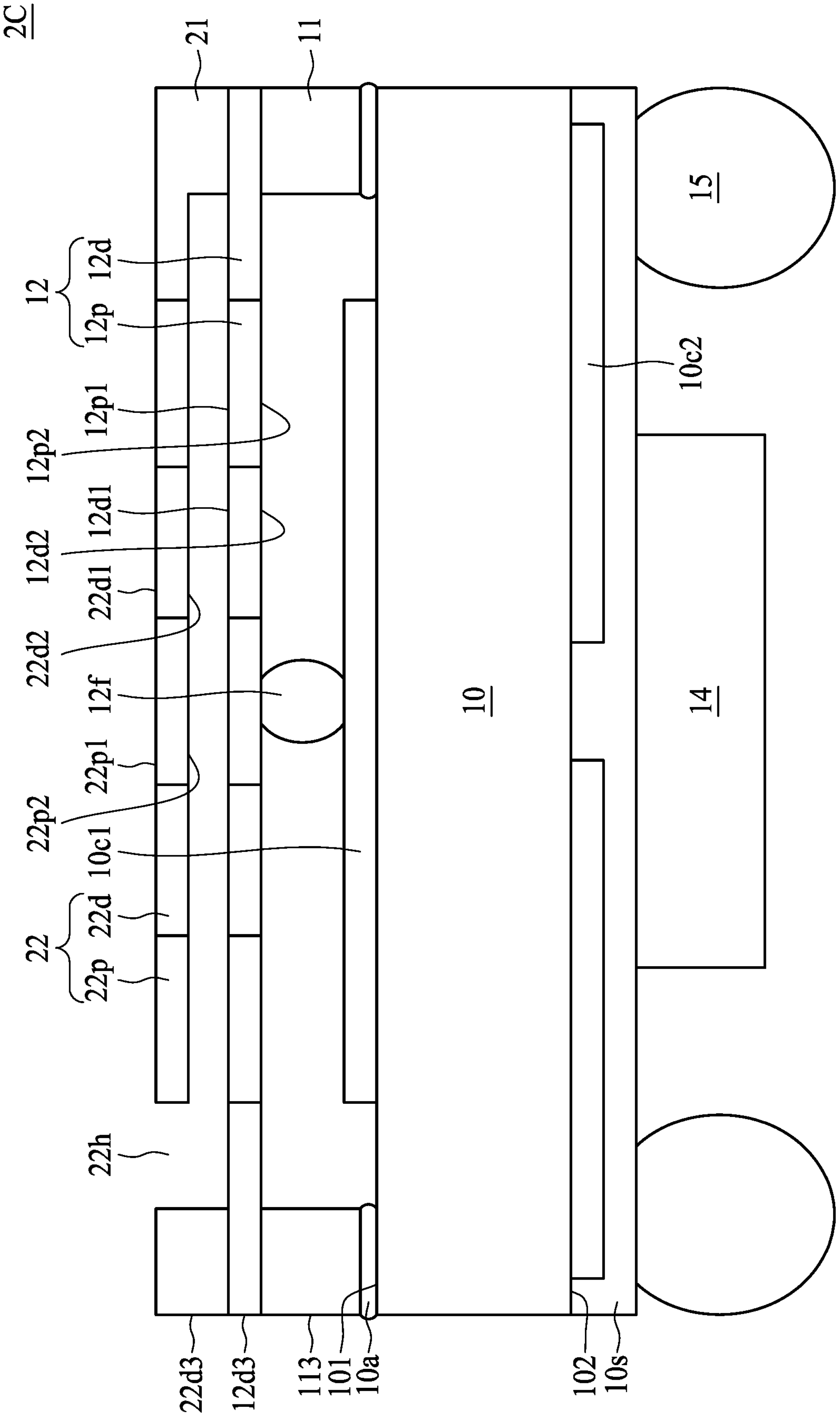
FIG. 2C illustrates a cross-sectional view of a semiconductor device package in accordance with some embodiments of the present disclosure.

FIG. 2C illustrates a cross-sectional view of a semiconductor device package in accordance with some embodiments of the present disclosure. The semiconductor device package in FIG. 2C is similar to the semiconductor device package 2A as shown in FIG. 2A, except that the antenna 22 in FIG. 2C further includes an opening 22_h_ penetrating the dielectric layer 22_d_ of the antenna 22 to expose the antenna 12. In some embodiments, the opening 22_h_ is located adjacent to the periphery of the antenna 22.

FIG. 3A, FIG. 3B, FIG. 3C, FIG. 3D, FIG. 3E, FIG. 3F, FIG. 3G, FIG. 3H, FIG. 3I, FIG. 3J, FIG. 3K and FIG. 3L are cross-sectional views of an antenna structure fabricated at various stages, in accordance with some embodiments of the present disclosure. Various figures have been simplified for a better understanding of the aspects of the present disclosure. In some embodiments, the operations shown in FIG. 3A, FIG. 3B, FIG. 3C, FIG. 3D, FIG. 3E, FIG. 3F, FIG.

3G, FIG. 3H, FIG. 3I, FIG. 3J, FIG. 3K and FIG. 3L are a method for manufacturing the antenna structure including the support structure 11 and the antenna 12. Alternatively, the operations shown in FIG. 3A, FIG. 3B, FIG. 3C, FIG. 3D, FIG. 3E, FIG. 3F, FIG. 3G, FIG. 3H, FIG. 3I, FIG. 3J, FIG. 3K and FIG. 3L are a method for manufacturing other antenna structures.

Figure 3A:
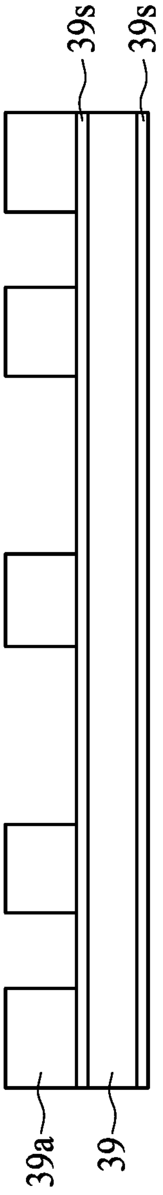
FIG. 3A, FIG. 3B, FIG. 3C, FIG. 3D, FIG. 3E, FIG. 3F, FIG. 3G, FIG. 3H, FIG. 3I, FIG. 3J, FIG. 3K and FIG. 3L are cross-sectional views of an antenna structure fabricated at various stages, in accordance with some embodiments of the present disclosure.

Referring to FIG. 3A, a carrier 39 is provided. The carrier 39 may be a metal plate, such as a copper plate. In some embodiments, the carrier 39 has seed layers 39*s* disposed on its both surfaces. A patterned photoresist 39*a* (e.g., mask) is disposed on the carrier 39.

Figure 3B:
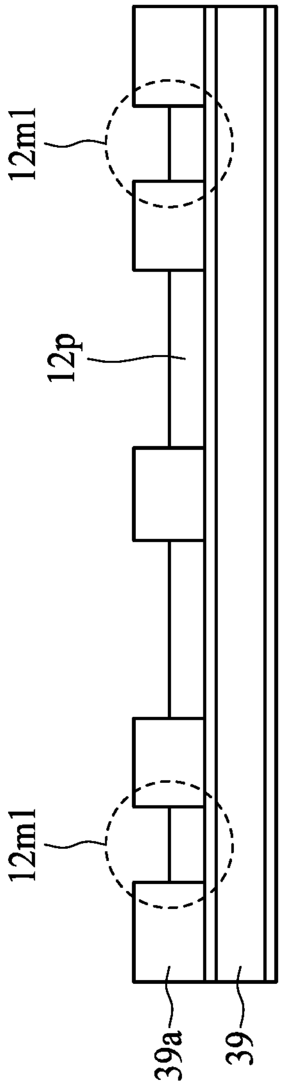

Referring to FIG. 3B, an antenna pattern 12*p* is formed on the carrier 39. In some embodiments, the antenna pattern 12*p* is formed by, for example, sputtering, coating, electroplating or any other suitable operations. In some embodiments, a portion of the antenna pattern 12*p* (e.g., the portion encircled by dotted-line circles 12*m*1) can be used as an alignment mark.

Figure 3C:
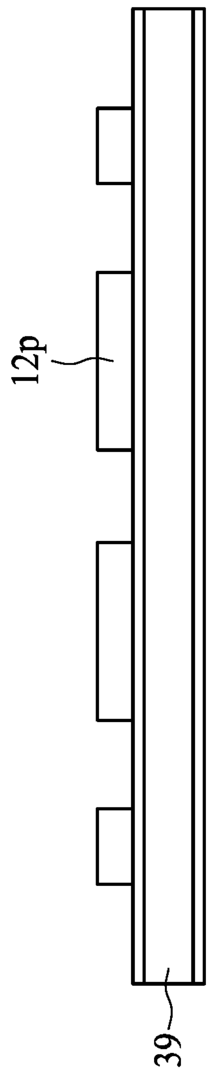
Figure 3D:
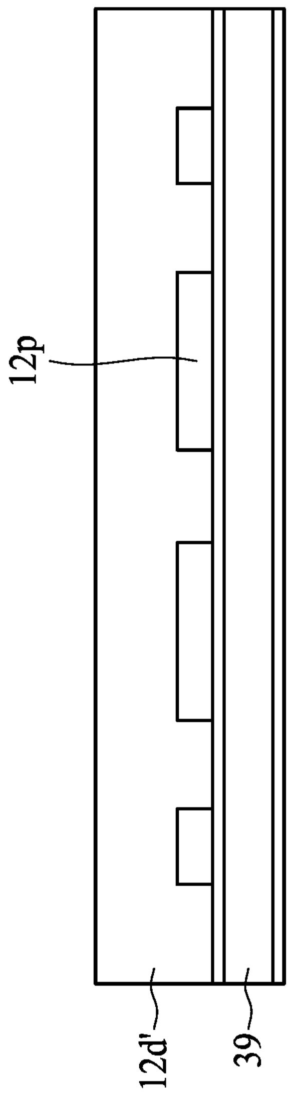

Referring to FIG. 3C, the photoresist 39*a* is removed from the carrier 39. A dielectric layer 12*d*' is then formed on the antenna pattern 12*p* to fully cover the antenna pattern 12*p* as shown in FIG. 3D. For example, the dielectric layer 12*d*' is formed on exterior surfaces of the antenna pattern 12*p* and within gaps defined by the antenna pattern 12*p*.

Figure 3E:
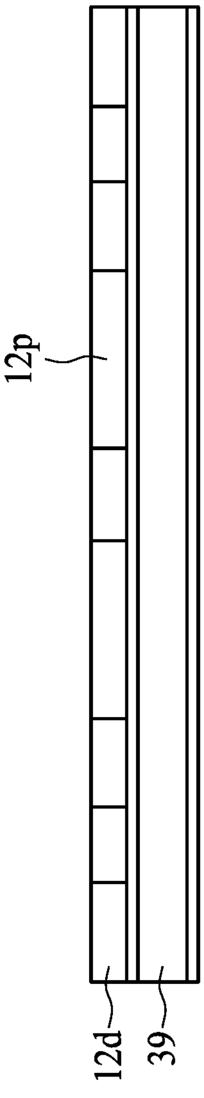

Referring to FIG. 3E, a portion of the dielectric layer 12*d*' is removed to form the dielectric layer 12*d* to expose a top surface of the antenna pattern 12*p*. In some embodiments, the top surface of the antenna pattern 12*p* is substantially coplanar with a top surface of the dielectric layer 12*d*. In some embodiments, the top surface of the antenna pattern 12*p* recesses from the top surface of the dielectric layer 12*d*. In some embodiments, the top surface of the antenna pattern 12*p* protrudes beyond the top surface of the dielectric layer 12*d*. In some embodiments, the portion of the dielectric layer 12*d*' is removed by, for example, etching, grinding, laser or any other suitable operations.

Figure 3F:
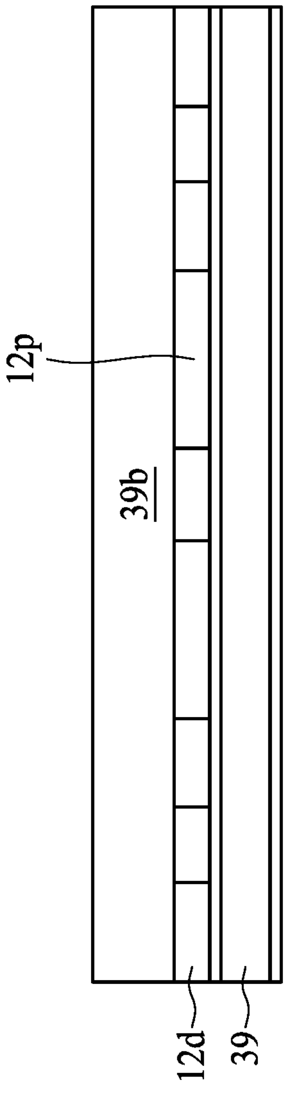
Figure 3G:
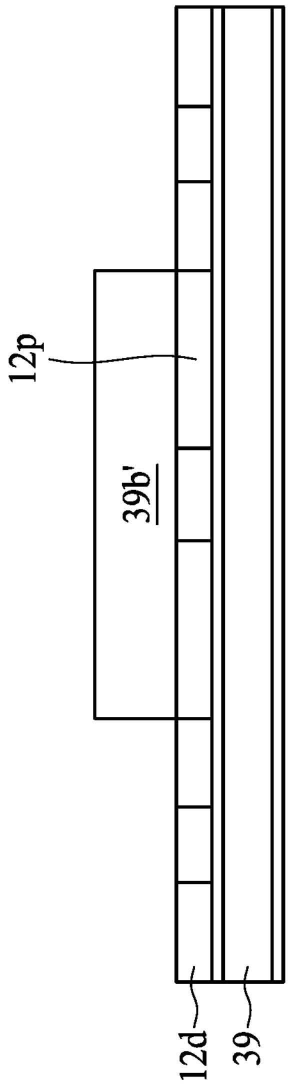

Referring to FIG. 3F, a photoresist 39*b* (e.g., a dry film) is disposed on the antenna pattern 12*p* and the dielectric layer 12*d* to cover the antenna pattern 12*p* and the dielectric layer 12*d*. Then, a portion of the photoresist 39 is removed to form a photoresist 39*b*' as shown in FIG. 3G.

Figure 3H:
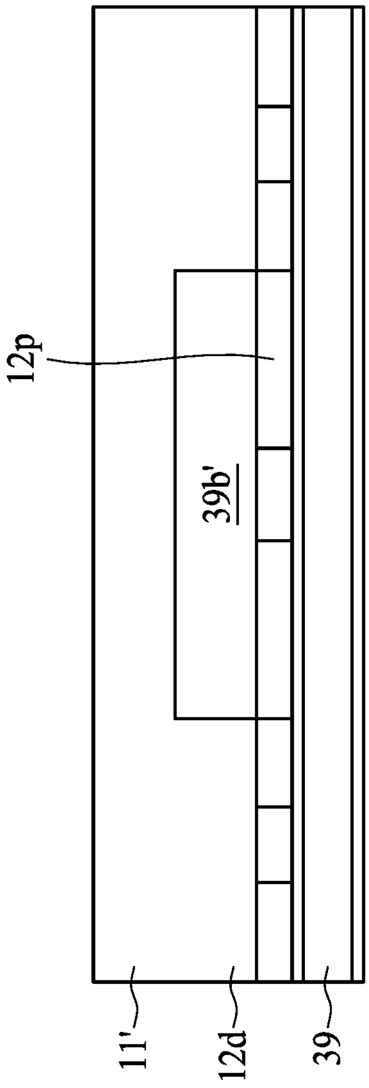
Figure 3I:
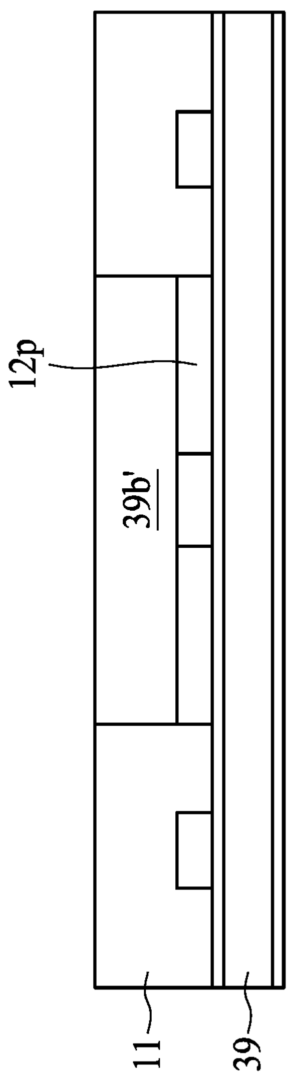

Referring to FIG. 3H, a protection layer 11' (e.g., a dielectric layer) is formed to cover the photoresist 39' and a portion of the dielectric layer 12*d* exposed from the photoresist 39'. A portion of the protection layer 11' is then removed by, for example, grinding to form the support structure 11 as shown in FIG. 3I.

Figure 3J:
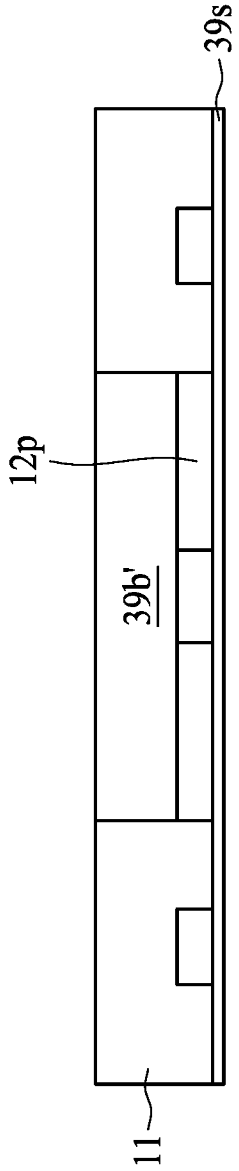
Figure 3K:
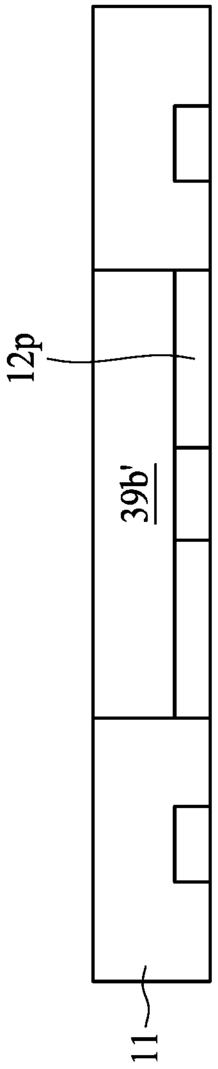

Referring to FIG. 3J, the carrier 39 is removed. In some embodiments, the seed layer 39*s* may be remained on the dielectric layer 12*d* and the antenna pattern 12*p*. Then, the seed layer 39*s* can be removed by, for example, etching or any other suitable processes as shown in FIG. 3K.

Figure 3L:
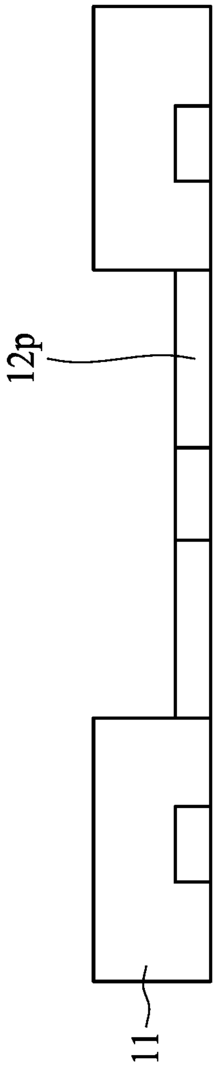

Referring to FIG. 3L, the photoresist 39' is removed by, for example, developing or any other suitable processes to form the antenna structure including the support structure 11 and the antenna 12 as shown in FIG. 1A.

FIG. 4A, FIG. 4B, FIG. 4C, FIG. 4D, FIG. 4E, FIG. 4F, FIG. 4G, FIG. 4H, FIG. 4I, FIG. 4J, FIG. 4K, FIG. 4L, FIG. 4M and FIG. 4N are cross-sectional views of an antenna structure fabricated at various stages, in accordance with some embodiments of the present disclosure. Various figures have been simplified for a better understanding of the aspects of the present disclosure. In some embodiments, the operations shown in FIG. 4A, FIG. 4B, FIG. 4C, FIG. 4D, FIG. 4E, FIG. 4F, FIG. 4G, FIG. 4H, FIG. 4I, FIG. 4J, FIG. 4K, FIG. 4L, FIG. 4M and FIG. 4N are a method for manufacturing the antenna structure including the support structures 11, 21 and the antenna 12, 22 as shown in FIG. 2C. Alternatively, the operations shown in FIG. 4A, FIG. 4B, FIG. 4C, FIG. 4D, FIG. 4E, FIG. 4F, FIG. 4G, FIG. 4H, FIG. 4I, FIG. 4J, FIG. 4K, FIG. 4L, FIG. 4M and FIG. 4N are a method for manufacturing other antenna structures.

Figure 4A:
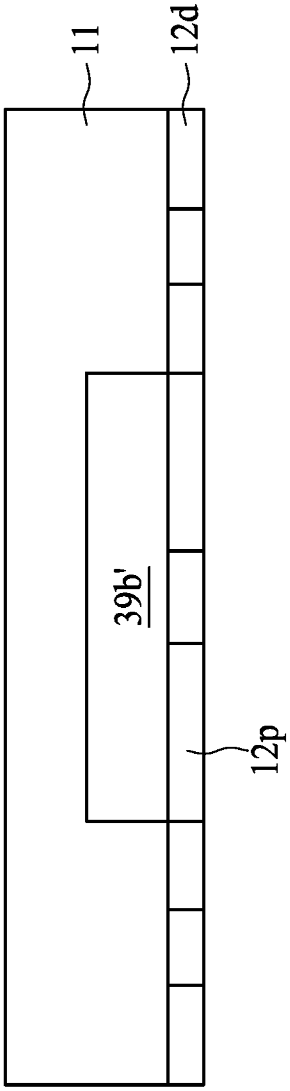
FIG. 4A, FIG. 4B, FIG. 4C, FIG. 4D, FIG. 4E, FIG. 4F, FIG. 4G, FIG. 4H, FIG. 4I, FIG. 4J, FIG. 4K, FIG. 4K'.

In some embodiments, the operation in FIG. 4A is carried out after the operation in FIG. 3I. Referring to FIG. 4A, the carrier 39 including the seed layers 39*s* is removed.

Figure 4B:
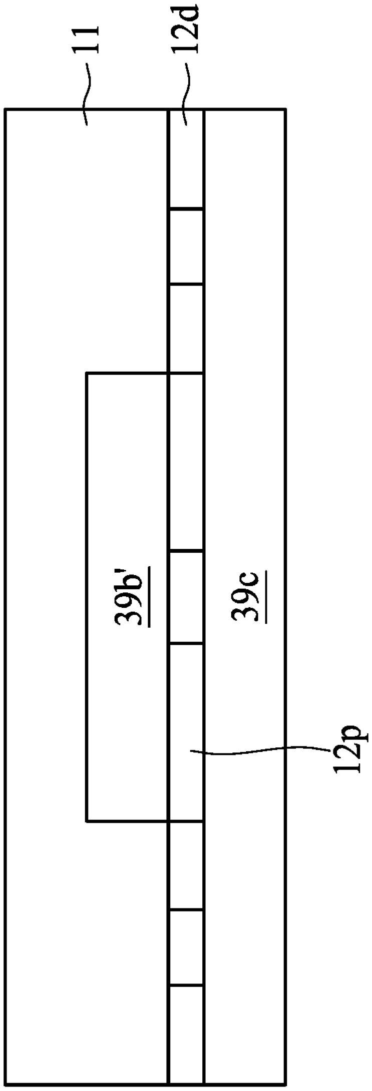

Referring to FIG. 4B, a photoresist 39*c* (e.g., a dry film) is formed on the surfaces of the dielectric layer 12*d* and the antenna pattern 12*p* facing away from the photoresist 39*b*'.

Figure 4C:
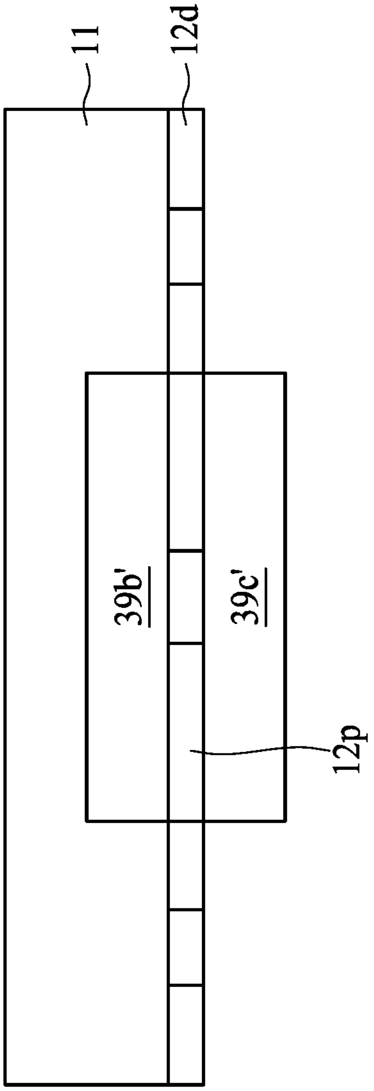

Referring to FIG. 4C, a portion of the photoresist 39*c* is removed to form the photoresist 39*c*'. In some embodiments, the photoresist 39*c*' is substantially aligned with the photoresist 39*b*.

Figure 4D:
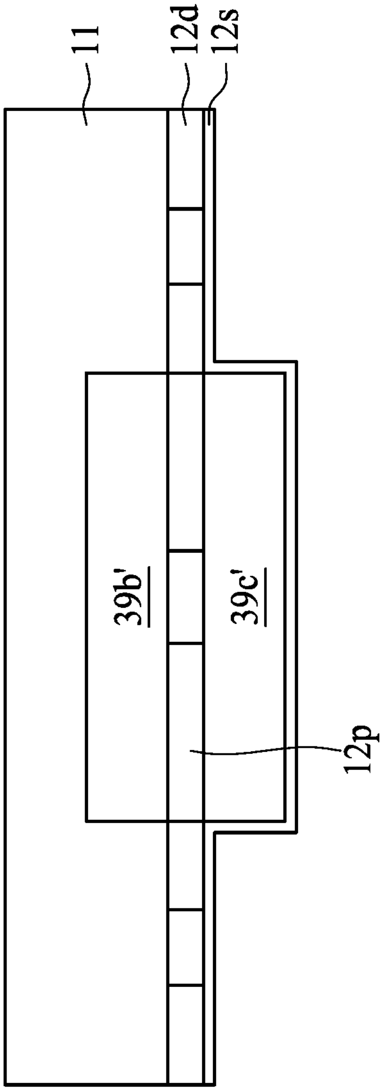
Figure 4E:
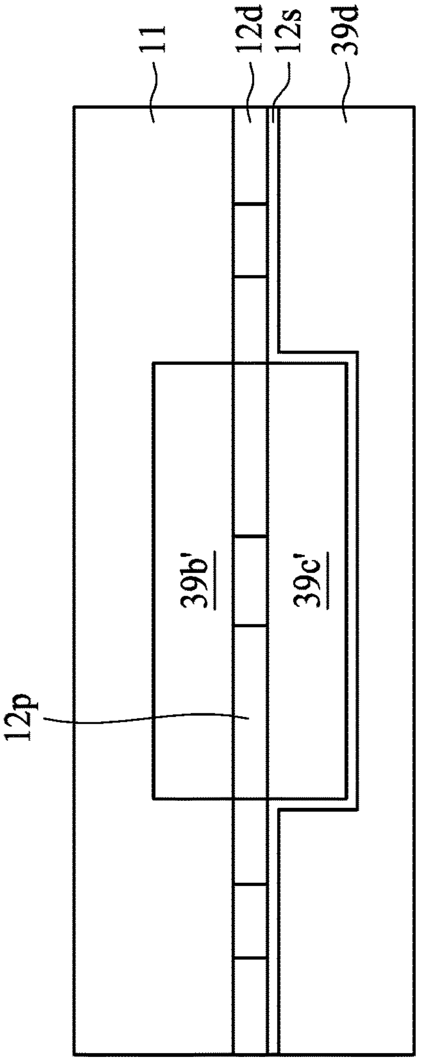

Referring to FIG. 4D, a seed layer 12*s* is formed on the photoresist 39*c*' and the exposed portion of the antenna pattern 12*p* and the dielectric layer 12*d*. Then, a photoresist 39*d* is formed on the seed layer 12*s* as shown in FIG. 4E.

Figure 4F:
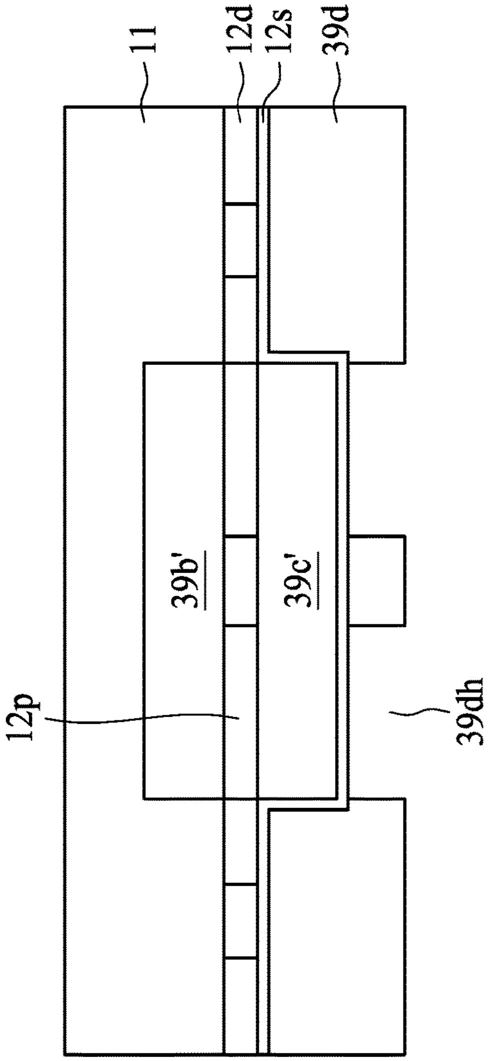
Figure 4G:
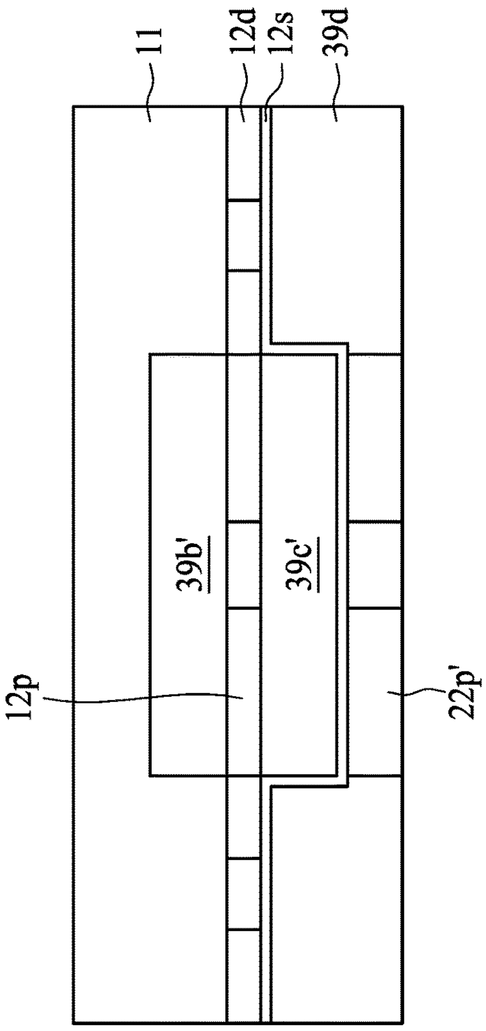

Referring to FIG. 4F, a portion of the photoresist 39*d* is removed to form openings 39*dh* to expose the seed layer 12*s*. Then a metal layer 22*p*' is formed within the openings 39*dh* to contact the seed layer 12*s* as shown in FIG. 4G.

Figure 4H:
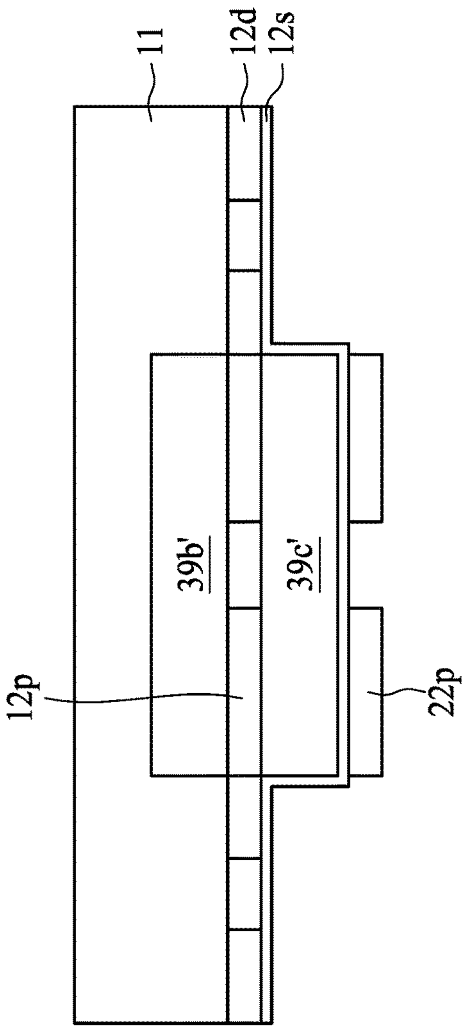
Figure 4I:
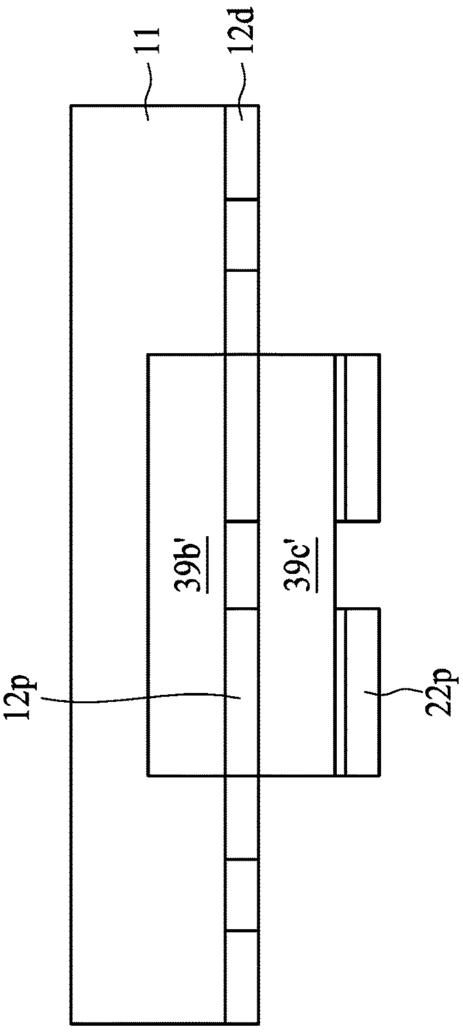

Referring to FIG. 4H and FIG. 4I, the photoresist 39*d*, the seed layer 12*s* and a portion of the metal layer 22*p*' are removed to form the antenna pattern 22*p* as shown in FIG. 4I.

Figure 4J:
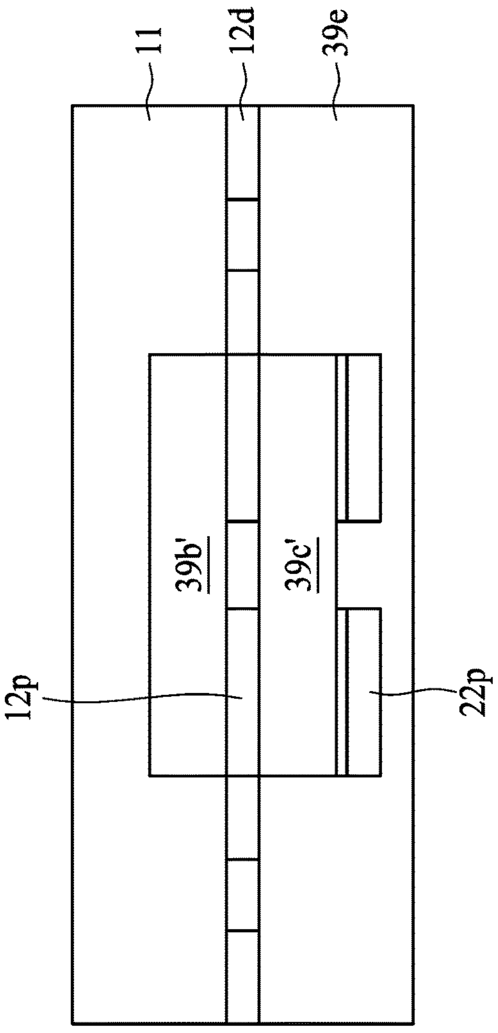

Referring to FIG. 4J, a photoresist 39*e* (e.g., a dry film) is formed to cover the dielectric layer 12*d*, the antenna pattern 12*p*, the photoresist 39*c*' and the antenna pattern 22*p*. In some embodiments, the photoresist 39*e* and the photoresist 39*b*', 39*c*' include different types of photoresist. For example, if the photoresist 39*e* is a positive photoresist, the photoresists 39*b*' and 39*c*' are a negative photoresist, and vice versa.

Figure 4K:
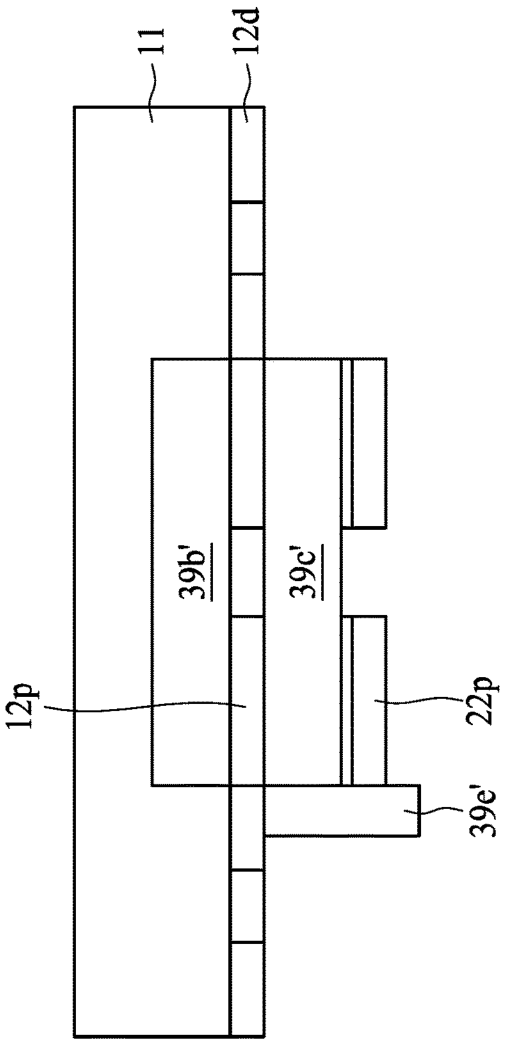
Figure 4K:
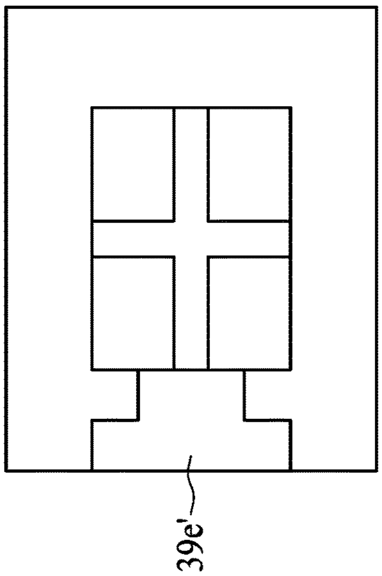

Referring to FIG. 4K, a portion of the photoresist 39*e* is removed to form the photoresist 39*e*'. As shown in FIGS. 4K and 4K', the photoresist 39*e*' is located adjacent to an edge of the photoresist 39*c*'.

Figure 4L:
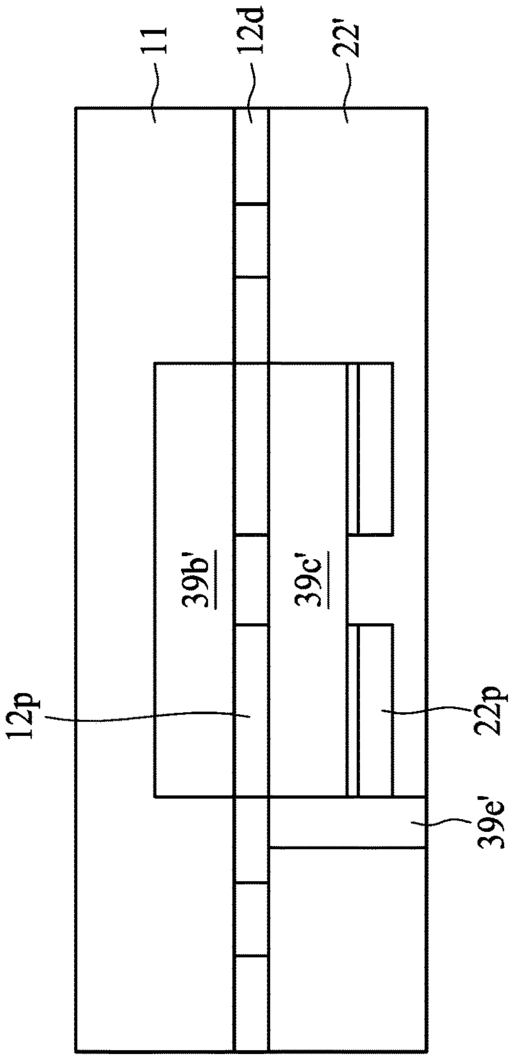
FIG. 4L, FIG. 4M and FIG. 4N are cross-sectional views of an antenna structure fabricated at various stages, in accordance with some embodiments of the present disclosure.

Referring to FIG. 4L, a protection layer (e.g., a dielectric layer) 22' is formed to cover the dielectric layer 12*d*, the antenna pattern 12*p*, the photoresist 39*c*', the antenna pattern 22*p* and the photoresist 39*e*'.

Figure 4M:
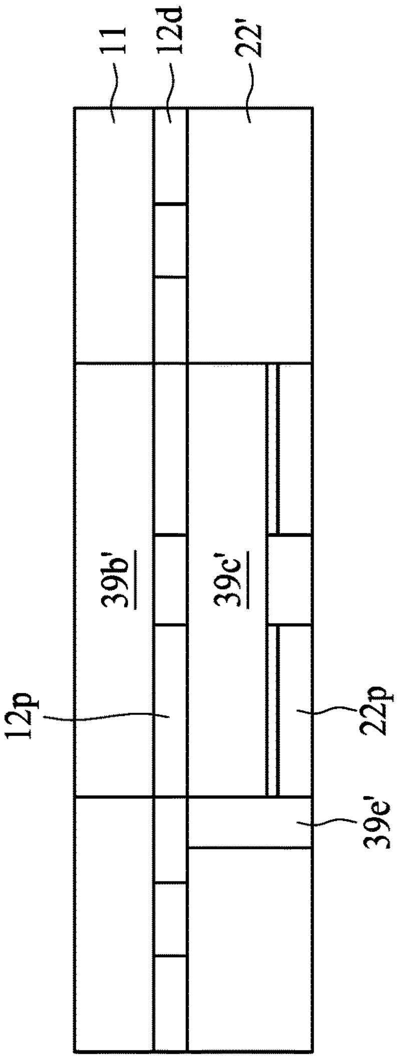

Referring to FIG. 4M, a portion of the protection layer 22' is removed to form the support structure 22 and to expose the antenna pattern 22*p*.

Figure 4N:
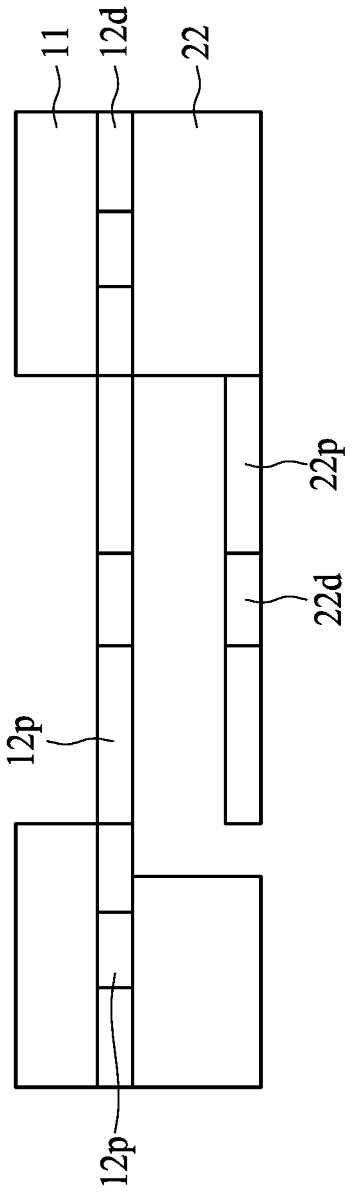

Referring to FIG. 4N, the photoresists 39*b*', 39*c*' and 39*e*' are removed by, for example, developing or any other suitable processes to form the antenna structure including the support structures 11, 21 and the antenna 12, 22 as shown in FIG. 2C.

As used herein, spatially relative terms, such as "beneath," "below," "lower," "above," "upper," "lower," "left," "right" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It should be understood that when an element is referred to as being "connected to" or "coupled to" another element, it may be directly connected to or coupled to the other element, or intervening elements may be present.

Ranges can be expressed herein as from one endpoint to another endpoint or between two endpoints. All ranges disclosed herein are inclusive of the endpoints, unless specified otherwise.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" or "about" the same if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 0° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

For example, two surfaces can be deemed to be coplanar or substantially coplanar if a displacement between the two surfaces is equal to or less than 5 μm, equal to or less than 2 μm, equal to or less than 1 μm, or equal to or less than 0.5 μm. A surface can be deemed to be planar or substantially planar if a displacement of the surface relative to a flat plane between any two points on the surface is equal to or less than 5 μm, equal to or less than 2 μm, equal to or less than 1 μm, or equal to or less than 0.5 μm.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

As used herein, the singular terms "a," "an," and "the" may include plural referents unless the context clearly dictates otherwise. In the description of some embodiments, a component provided "on" or "over" another component can encompass cases where the former component is directly on (e.g., in physical contact with) the latter component, as well as cases where one or more intervening components are located between the former component and the latter component.

Spatial descriptions, such as "above," "below," "up," "left," "right," "down," "top," "bottom," "vertical," "horizontal," "side," "higher," "lower," "upper," "over," "under," "downward," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated from by such arrangement While the present disclosure has been described and illustrated with reference to specific embodiments thereof, these descriptions and illustrations do not limit the present disclosure. It can be clearly understood by those skilled in the art that various changes may be made, and equivalent components may be substituted within the embodiments without departing from the true spirit and scope of the present disclosure as defined by the appended claims. The illustrations may not necessarily be drawn to scale. There may be distinctions between the artistic renditions in the present disclosure and the actual apparatus, due to variables in manufacturing processes and such. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it can be understood that these operations may be combined, sub-divided, or re-ordered to form an equivalent method without departing from the teachings of the present disclosure. Therefore, unless specifically indicated herein, the order and grouping of the operations are not limitations of the present disclosure.

The foregoing outlines features of several embodiments and detailed aspects of the present disclosure. The embodiments described in the present disclosure may be readily used as a basis for designing or modifying other processes and structures for carrying out the same or similar purposes and/or achieving the same or similar advantages of the embodiments introduced herein. Such equivalent constructions do not depart from the spirit and scope of the present disclosure, and various changes, substitutions, and alterations may be made without departing from the spirit and scope of the present disclosure.

What is claimed is:

1. A semiconductor device package, comprising:

a substrate having a first surface and a second surface opposite to the first surface;

a support structure disposed on the first surface of the substrate; and a first antenna disposed on the support structure, the first antenna having a first surface facing the substrate, a second surface opposite to the first surface and a lateral surface extending between the first surface and a second surface of the first antenna, wherein the first antenna includes a dielectric layer and an antenna pattern disposed within the dielectric layer and penetrating the dielectric layer;

the dielectric layer of the first antenna pattern has a first surface facing away from the substrate and a second surface opposite to the first surface;

the antenna pattern of the first antenna pattern has a first surface facing away from the substrate and a second surface opposite to the first surface;

the first surface of the dielectric layer is substantially coplanar with the first surface of the antenna pattern; and the second surface of the dielectric layer is substantially coplanar with the second surface of the antenna pattern.

2. The semiconductor device package of claim 1, wherein the dielectric layer of the first antenna and the support structure are formed of a molding compound.

3. A semiconductor device package, comprising:

a substrate having a first surface and a second surface opposite to the first surface;

a support structure disposed on the first surface of the substrate;

a first antenna disposed on the support structure, the first antenna having a first surface facing the substrate, a second surface opposite to the first surface and a lateral surface extending between the first surface and a second surface of the first antenna, wherein the first antenna includes a dielectric layer and an antenna pattern disposed within the dielectric layer and penetrating the dielectric layer;

a conductive layer disposed within the dielectric layer of the first antenna; and a conductive via disposed within the support structure and electrically connecting the conductive layer with the substrate.

4. A semiconductor device package, comprising:

a substrate having a first surface and a second surface opposite to the first surface;

a support structure disposed on the first surface of the substrate;

a first antenna disposed on the support structure, the first antenna having a first surface facing the substrate, a second surface opposite to the first surface and a lateral surface extending between the first surface and a second surface of the first antenna, wherein the first antenna includes a dielectric layer and an antenna pattern disposed within the dielectric layer and penetrating the dielectric layer; and a second antenna disposed on the first antenna, wherein the second antenna includes:

a support structure disposed on the first antenna;

a dielectric layer disposed on the support structure of the second antenna; and an antenna pattern disposed within the dielectric layer of the second antenna and penetrating the dielectric layer of the second antenna.

5. The semiconductor device package of claim 4, wherein the antenna pattern of the first antenna is substantially aligned with the antenna pattern of the second antenna.

6. A semiconductor device package, comprising:

a substrate having a first surface and a second surface opposite to the first surface;

a support structure disposed on the first surface of the substrate; and a first antenna disposed on the support structure, the first antenna having a first surface facing the substrate, a second surface opposite to the first surface and a lateral surface extending between the first surface and a second surface of the first antenna, wherein the first antenna includes a dielectric layer and an antenna pattern disposed within the dielectric layer and penetrating the dielectric layer;

the antenna pattern of the first antenna includes a first portion and a second portion; and a width of the first portion is greater than a width of the second portion.

7. A semiconductor device package, comprising:

a substrate having a first surface and a second surface opposite to the first surface;

a support structure disposed on the first surface of the substrate; and a first antenna disposed on the support structure, the first antenna having a first surface facing the substrate, a second surface opposite to the first surface and a lateral surface extending between the first surface and a second surface of the first antenna, wherein the first antenna includes a dielectric layer and an antenna pattern disposed within the dielectric layer and penetrating the dielectric layer; and the support structure has a lateral surface substantially coplanar with the lateral surface of the first antenna.

8. A semiconductor device package, comprising:

a substrate having a first surface and a second surface opposite to the first surface; and a first antenna disposed on the first surface of the substrate, the first antenna having a dielectric layer and an antenna pattern, the dielectric layer having a first surface facing away from the substrate and a second surface opposite to the first surface and spaced apart from the first surface of the substrate, wherein the antenna pattern is disposed within the dielectric layer and exposed from the first surface and the second surface of the dielectric layer.

9. The semiconductor device package of claim 8, wherein the first surface of the substrate and the first antenna define an air cavity.

10. The semiconductor device package of claim 8, wherein the antenna pattern of the first antenna pattern has a first surface facing away from the substrate and a second surface opposite to the first surface;

the first surface of the dielectric layer is substantially coplanar with the first surface of the antenna pattern; and the second surface of the dielectric layer is substantially coplanar with the second surface of the antenna pattern.

11. The semiconductor device package of claim 8, further comprising a second antenna disposed on the first antenna, the second antenna having a first surface facing away from the first antenna, a second surface facing the first antenna and spaced apart from the first antenna and a third surface in contact with the first surface of the first antenna, wherein the antenna pattern of the second antenna is disposed within the dielectric layer of the second antenna and exposed from the first surface and the second surface of the dielectric layer of the second antenna.

12. The semiconductor device package of claim 11, wherein the antenna pattern of the first antenna is substantially aligned with the antenna pattern of the second antenna.

13. A method of manufacturing a semiconductor device package, comprising:

(a) providing a carrier;

(b) forming an antenna layer on the carrier;

(c) forming a first dielectric layer on the carrier to cover the antenna layer and to expose a top surface of the antenna layer; and (d) forming a second dielectric layer on the first dielectric layer and adjacent to the periphery of the first dielectric layer to expose the antenna layer.

14. The method of claim 13, wherein operation (c) further comprises:

forming the first dielectric layer on the carrier to fully cover the antenna layer; and thinning the first dielectric layer to expose the top surface of the antenna layer.

15. The method of claim 13, wherein operation (d) further comprises:

forming a first sacrificed layer on the top surface of the antenna layer exposed from the first dielectric layer;

forming a second dielectric layer on a portion of the dielectric layer exposed from the first sacrificed layer; and removing the first sacrificed layer to expose the top surface of the antenna layer.

16. The method of claim 13, wherein the antenna layer includes a first antenna pattern and a second antenna pattern.

17. The method of claim 16, wherein a projection of the second dielectric layer on the carrier is spaced apart from a projection of the first antenna pattern on the carrier.

18. The method of claim 16, further comprising:

removing the carrier to expose a bottom surface of the first antenna pattern opposite to the top surface of the antenna pattern and a surface of the first dielectric layer substantially coplanar with the bottom surface of the first antenna pattern;

forming a second sacrificed layer on the bottom surface of the first antenna; and forming a second antenna pattern on the second sacrificed layer, wherein the second antenna pattern is substantially aligned with the first antenna pattern.

19. The method of claim 18, further comprising:

forming a third dielectric layer on the surface of the first dielectric layer, the third dielectric layer covering a first portion of the lateral surface of the second sacrificed layer and exposing a second portion of the lateral surface of the second sacrificed layer and a surface of the second antenna pattern facing away from the first antenna pattern; and removing the second sacrificed layer to form an air cavity between the first antenna pattern and the second antenna pattern.

* * * * *